United States Patent [19]

New et al.

[11] Patent Number: 6,091,263
[45] Date of Patent: Jul. 18, 2000

[54] RAPIDLY RECONFIGURABLE FPGA HAVING A MULTIPLE REGION ARCHITECTURE WITH RECONFIGURATION CACHES USEABLE AS DATA RAM

[75] Inventors: Bernard J. New, Los Gatos; Robert Anders Johnson, San Jose; Ralph Wittig, Sunnyvale; Sundararajarao Mohan, Cupertino, all of Calif.

[73] Assignee: Xilinx, Inc., San Jose, Calif.

[21] Appl. No.: 08/989,746

[22] Filed: Dec. 12, 1997

[51] Int. Cl.[7] ....................... H03K 19/177; H03K 19/173
[52] U.S. Cl. ............................... 326/40; 326/39; 326/41; 326/47
[58] Field of Search ....................... 326/38, 39, 40, 326/41, 47

[56] References Cited

U.S. PATENT DOCUMENTS

| Re. 34,363 | 8/1993 | Freeman | 307/465 |
|---|---|---|---|
| 5,426,378 | 6/1995 | Ong | 326/39 |
| 5,600,263 | 2/1997 | Trimberger et al. | 326/39 |
| 5,705,938 | 1/1998 | Kean | 326/39 |
| 5,726,584 | 3/1998 | Freidin | 326/38 |
| 5,773,993 | 6/1998 | Trimberger | 326/38 |
| 5,801,547 | 9/1998 | Kean | 326/40 |

OTHER PUBLICATIONS

"The Programmable Logic Data Book", (1996), available from Xilinx, Inc., 2100 Logic Drive, San Jose, California 95124, pp. 4–21 through 4–23.

"The Programmable Logic Data Book", (1994), available from Xilinx, INc., 2100 Logic Drive, San Jose, California 95124, pp. 2–20 through 2–21.

*Primary Examiner*—Michael Tokar
*Assistant Examiner*—James H. Cho
*Attorney, Agent, or Firm*—E. Eric Hoffman; Jeanette S. Harms

[57] ABSTRACT

A field programmable gate array (FPGA) which includes first and second arrays of configurable logic blocks, and first and second configuration cache memories coupled to the first and second arrays of configurable logic blocks, respectively. The first configuration cache memory array can either store values for reconfiguring the first array of configurable logic blocks, or operate as a RAM. Similarly, the second configuration cache array can either store values for reconfiguring the second array of configurable logic blocks, or operate as a RAM. The first configuration cache memory array and the second configuration cache memory array are independently controlled, such that partial reconfiguration of the FPGA can be accomplished. In addition, the second configuration cache memory array can store values for reconfiguring the first (rather than the second) array of configurable logic blocks, thereby providing a second-level reconfiguration cache memory.

37 Claims, 14 Drawing Sheets

RAPIDLY RECONFIGURABLE FPGA HAVING A MULTIPLE REGION ARCHITECTURE WITH RECONFIGURATION CACHES USEABLE AS DATA RAM

BACKGROUND OF THE INVENTION

1. Field of the Invention

The present invention relates to a dynamically reconfigurable field programmable gate array (FPGA).

2. Description of Related Art

FPGAs typically include configurable logic blocks (CLBs) which can be reconfigured to implement various logical functions. The configuration of these CLBs is defined by the data stored in a corresponding set of configuration memory cells. These configuration memory cells have been programmed in several different manners. Typically, the configuration memory cells are sequentially programmed in response to an externally provided stream of configuration data values. Newer technology, such as that described in U.S. Pat. No. 5,600,263, teaches that the configuration data values for a particular configuration can be stored in a separate memory within the FPGA. The separate memory is connected in parallel to each of the configuration memory cells. To reconfigure the FPGA, an entire set of configuration data values stored in the separate memory is simultaneously transferred from the separate memory to the configuration memory cells. As a result, the reconfiguration of the entire FPGA is virtually instantaneous. However, a relatively large amount of overhead is incurred in providing parallel connections between the separate memory and each of the configuration memory cells. In addition, because all of the configuration memory cells are loaded simultaneously, partial reconfiguration of the FPGA cannot be performed. Moreover, while conventional FPGAs can be configured to provide for small amounts of user RAM, the capacity of this user RAM is typically limited by the data storage capacity of function generators present within the CLBs.

It would therefore be desirable to have an FPGA which reduces the amount of routing resources required to reconfigure the FPGA. It would further be desirable to have an FPGA which can be readily partially reconfigured. It would also be desirable if such an FPGA were also capable of being reconfigured to provide a relatively large user RAM.

SUMMARY OF THE INVENTION

Accordingly, the present invention provides a field programmable gate array (FPGA) comprising a first array of CLBs and a second array of CLBs. The first array of CLBs is coupled to a corresponding first configuration cache memory array. The first configuration cache memory array stores values for reconfiguring the first array of CLBs. Similarly, the second array of CLBs is coupled to a corresponding second configuration cache memory array. The second configuration cache memory array stores values for reconfiguring the second array of CLBs. The first and second configuration cache memory arrays are independently controllable, such that the first array of CLBs can be reconfigured in response to values stored in the first configuration cache memory array, while the second array of CLBs is not reconfigured. Thus, the FPGA is partially reconfigurable.

In a particular embodiment, the first and second configuration cache memory arrays each store values for reconfiguring the first and second arrays of CLBs in a plurality of configurations. For example, the first configuration cache memory array can store values corresponding to four different configurations of the first array of CLBs, and the second configuration cache memory array can store values corresponding to four different configurations of the second array of CLBs.

The values stored by the first and second configuration cache arrays can include sets of configuration data values for programming corresponding configuration memory cells in the first and second arrays of configurable logic blocks, as well as sets of state data values for programming corresponding function generators in the first and second arrays of configurable logic blocks. The sets of state data values can be shared among the various configurations of the arrays of CLBs, thereby providing additional flexibility in the reconfiguration of the FPGA.

In a particular embodiment, the values stored by the first and second configuration cache memory arrays are loaded into the first and second arrays of CLBs, respectively, over a plurality of operating cycles. By spreading the transfer of values over a plurality of operating cycles, the required routing resources between the configuration cache memory arrays and the arrays of CLBs are greatly reduced.

In one variation of the invention, the first and second configuration cache memory arrays are used as first-level and second-level configuration cache memories, respectively. In this variation, both the first and second configuration cache memory arrays store values for reconfiguring the first array of CLBs. If the values required for reconfiguration of the first array of CLBs are located in the second configuration cache memory array, then these values are transferred from the second configuration cache memory array to the first configuration cache memory array, and then to the first array of CLBs. The second array of CLBs has a fixed configuration in this variation. Using the second configuration cache memory array as a second-level cache can advantageously eliminate the need to access a device external to the FPGA for additional configuration data values.

In another variation, the first configuration cache memory array is used to store reconfiguration values for the first array of CLBS, while the second configuration cache memory is used as a random access memory (user RAM). This user RAM advantageously provides a relatively large on-chip RAM resource for the FPGA.

In yet another variation, the first and second configuration cache memory arrays can both be used to implement user RAM. An expansion bus system is provided to allow the user to select the size of the user RAM.

The present invention will be more fully understood in view of the following detailed description and drawings.

DETAILED DESCRIPTION OF THE DRAWINGS

Figure 1:
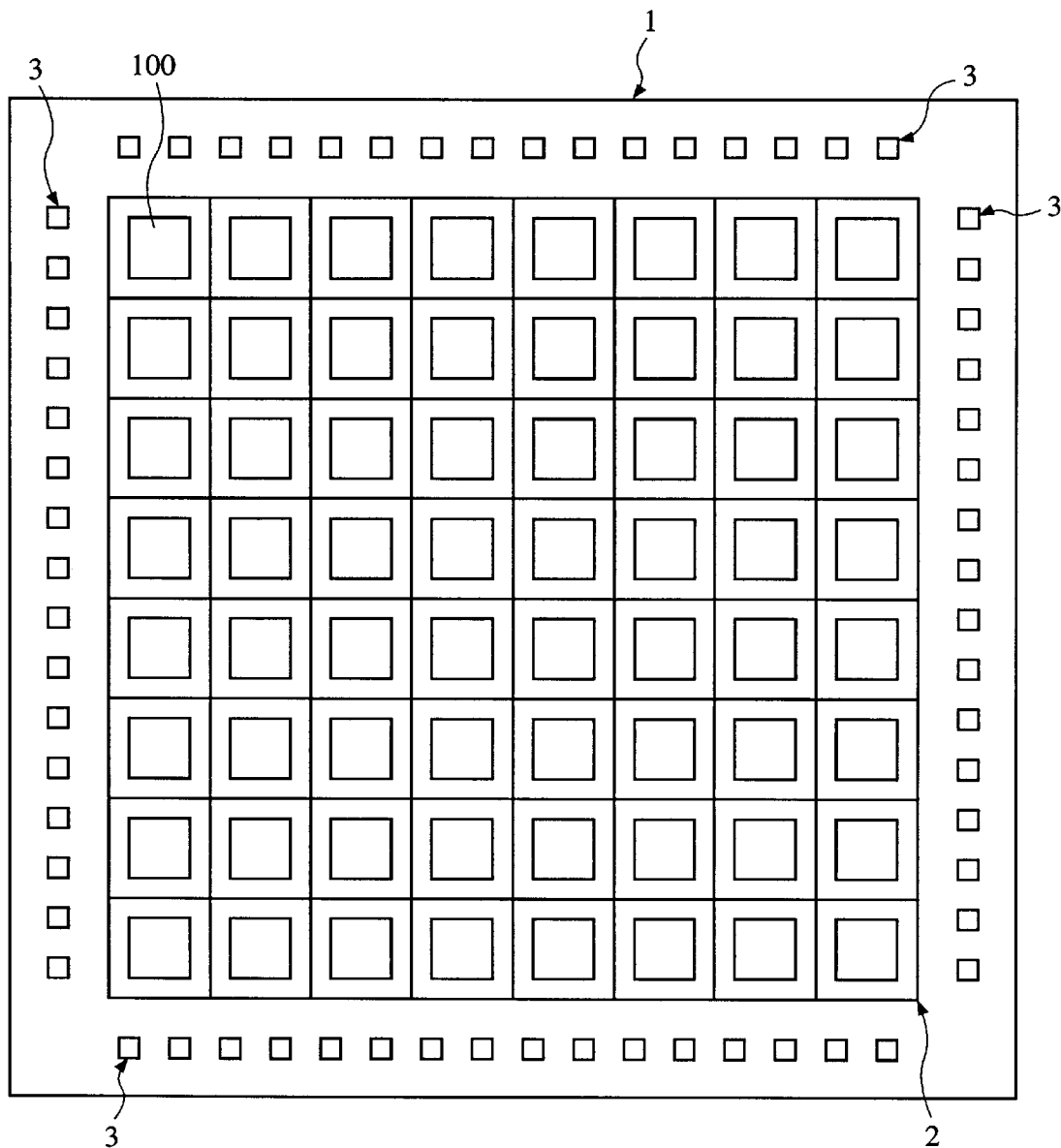
FIG. 1 is a block diagram of a conventional FPGA.

FIG. 1 is a block diagram of a field programmable gate array (FPGA) 1 which includes a centrally located array 2 of configurable logic blocks (CLBs), such as CLB 100, and a plurality of programmable input/output blocks (IOBs) 3 located around the perimeter of the FPGA 1. Programmable interconnect resources are located within the CLB array 2, and extend between the CLB array 2 and the IOBs 3. In general, the CLB array 2 provides the functional elements for constructing a logic circuit. The IOBs 3 provide an interface between the external pins of the FPGA 1 and the logic circuit implemented by the CLB array 2. The programmable interconnect resources provide routing paths to connect the CLBs 2 and IOBs 3 onto the desired networks. Customized configuration of the FPGA 1 is achieved by programming internal static configuration memory cells that determine the logic functions and interconnections of the CLBs 2, IOBs 3 and interconnect resources.

Figure 2:
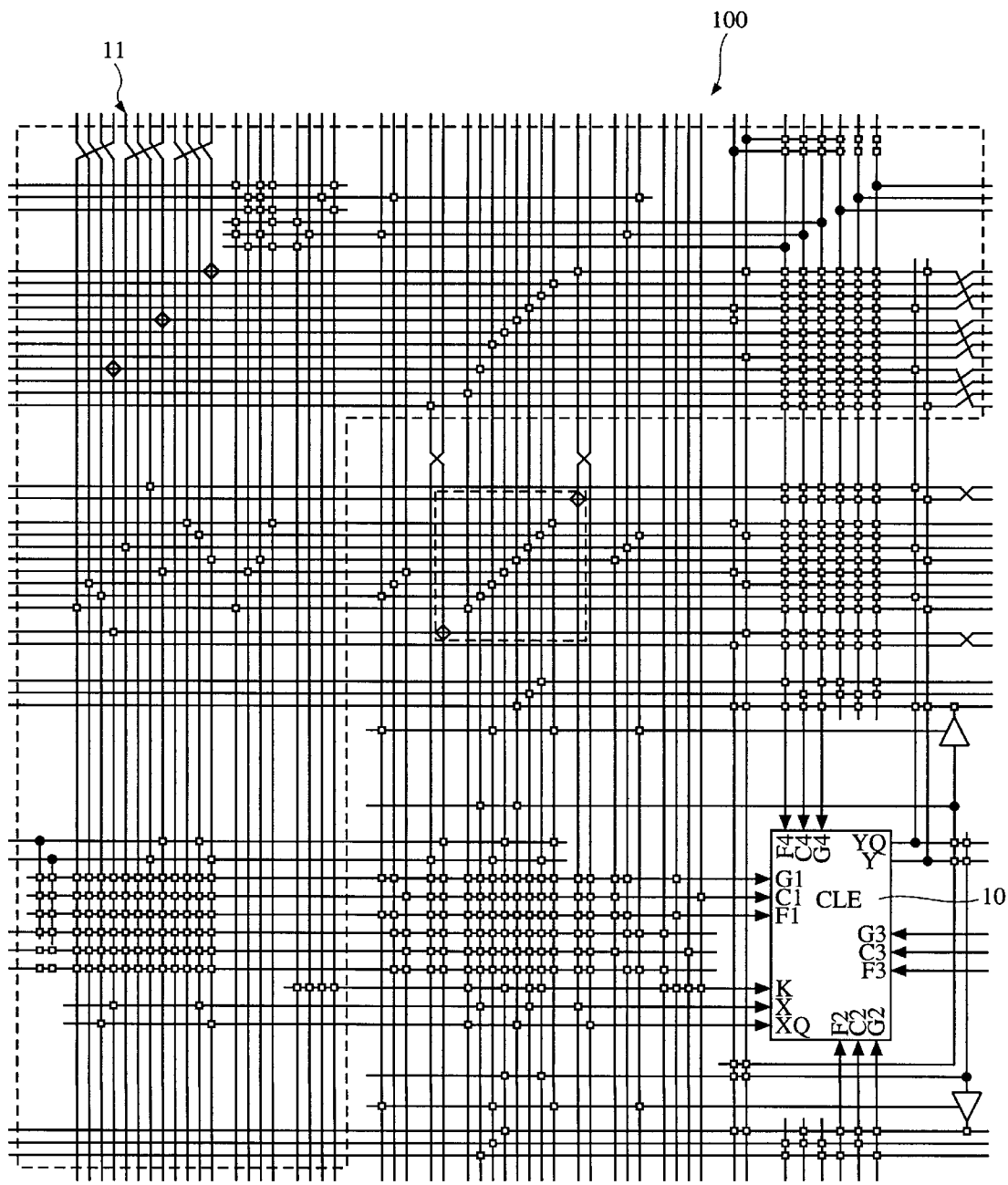
FIG. 2 is a schematic diagram of a conventional CLB.

FIG. 2 is a schematic diagram of a CLB 100 which is used in the XC4000EX™ family of FPGAs available from Xilinx, Inc., 2100 Logic Drive, San Jose, Calif. 95124. CLB 100 includes a configurable logic element (CLE) 10 and surrounding programmable interconnect resources 11. CLB 100 is positioned next to adjacent CLBs such that the programmable interconnect resources 11 of CLB 100 are connected to the programmable interconnect resources of the adjacent CLBs. The programmable interconnect resources 11 include a plurality of interconnect lines and a plurality of programmable interconnection points (PIPs). The PIPs, which are typically implemented using pass transistors and/or multiplexers, are illustrated as small empty boxes. These pass transistors are programmed to be either turned on (conducting) or turned off (non-conducting) in response to data values stored in corresponding configuration memory cells. In one variation, the PIPs can be encoded so the required number of configuration memory cells is less than or equal to the total number of PIPs. In the XC4000EX family of FPGAs, there are approximately 489 corresponding configuration memory cells which must be programmed to configure the programmable interconnect resources 11.

Figure 3:
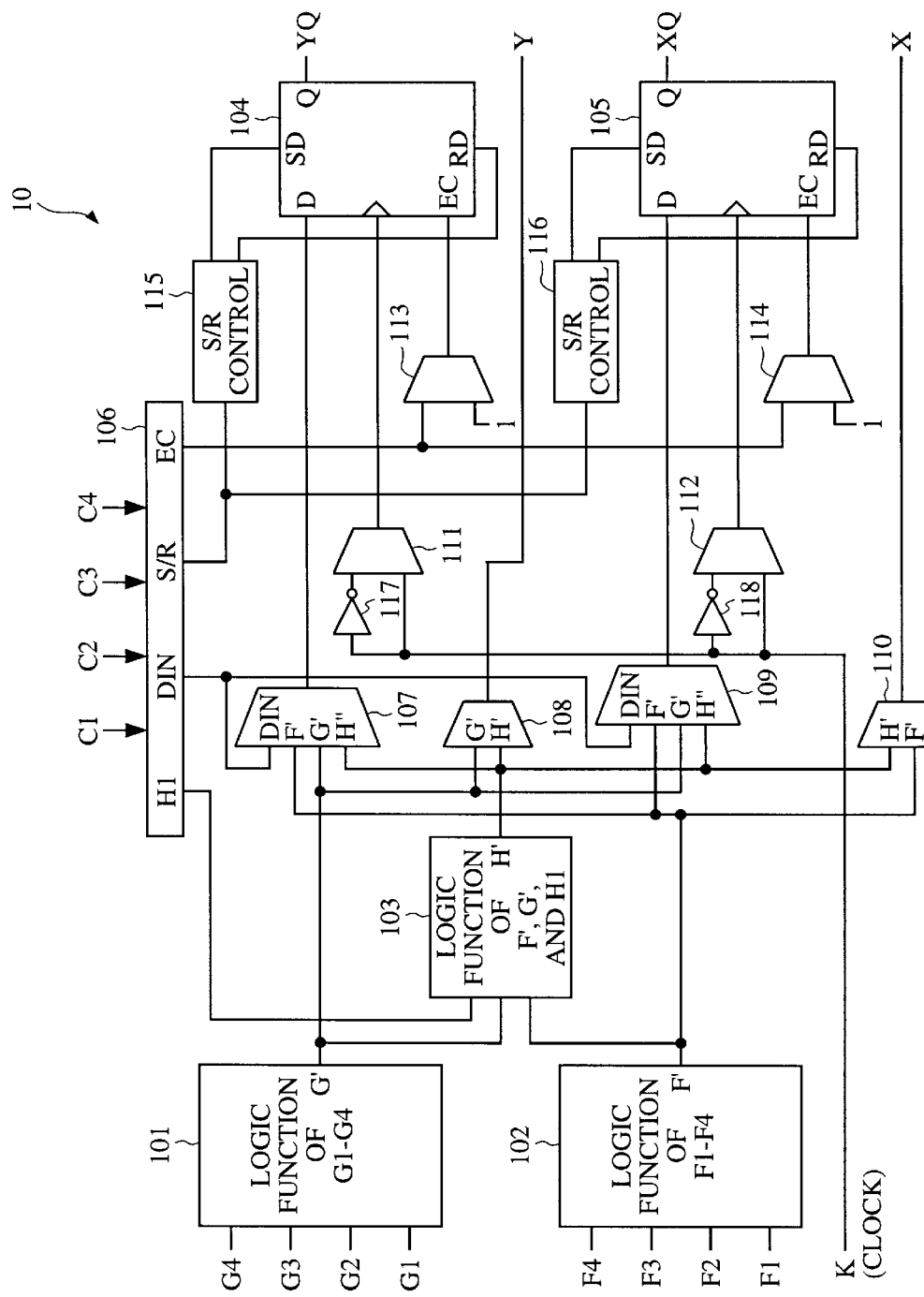
FIG. 3 is a schematic diagram of a CLE circuit found in the CLB of FIG. 2.

FIG. 3 is a schematic diagram of CLE circuit 10. CLE circuit 10 includes function generators 101–103, flip-flops 104–105, programmable switch 106, multiplexers 107–114, set/reset (S/R) control circuits 115–116 and inverters 117–118. CLE circuit 10 includes thirteen input terminals (which receive the input signals labeled F1–F4, G1–G4, C1–C4 and K) and four output terminals (which provide the output signals labeled X, Y, XQ and YQ). These input and output terminals provide access to the function generators 101–103 and flip flops 104–105. These input and output terminals are connected to programmable interconnect resources 11 as illustrated in FIG. 2.

Within CLE circuit 10, programmable switch 106 maps four control input signals C1–C4 into four internal control signals H1, DIN, S/R and EC in any arbitrary manner. Eight configuration memory cells must be programmed to control the routing performed by programmable switch 106. In other embodiments, more than eight configuration memory cells are programmed to control programmable switch 106. Function generator 101 receives the four input signals G1–G4 and provides an output signal G'. Similarly, function generator 102 receives the four input signals F1–F4 and provides an output signal F'. Each of function generators 101–102 is capable of implementing any arbitrarily defined Boolean function of their four input signals. To accomplish this, sixteen configuration memory cells must be programmed within each of function generators 101–102. Function generator 103 receives input signals F', G' and H1, and in response, provides an output signal H' which can be any Boolean function of these three input signals. To accomplish this, eight configuration memory cells must be programmed within function generator 103.

The F' or H' signal is routed through multiplexer 110 to the X output terminal. Similarly, the GI or Hi signal is routed through multiplexer 108 to the Y output terminal. Multiplexer 107 routes the DIN, F', G' or H' signal to flip-flop 104. Similarly, multiplexer 109 routes the DIN, F', G' or H' signal to flip-flop 105. Multiplexers 111 and 112 route the K signal or the inverse of the K signal to flip-flops 104 and 105, respectively. Multiplexers 113 and 114 route the EC signal or a logic '1' to flip flops 104 and 105, respectively. Multiplexers 107–114 are configured by programming associated configuration bit latches within CLE circuit 10. Each of multiplexers 108 and 110–114 is configured in response to a single configuration memory cell, whereas each of multiplexers 107 and 109 is programmed in response to two configuration memory cells.

Flip flops 104 and 105 are edge-triggered D-type flip-flops which operate in response to a clock signal, a clock enable (EC) signal, a data signal D, a set (SD) signal and a reset (RD) signal. Each flip flop can be triggered on either the rising or falling clock edge as determined by inverters 117–118 and multiplexers 111–112. The set and reset signals are provided by S/R control circuits 115–116 in response to the internal S/R control signal. The flip flops are either enabled by the internal EC control signal, or continuously enabled, as determined by the settings of multiplexers 113–114. Two configuration memory cells are required to store the data stored in flip flops 104 and 105.

Thus, a total of sixty configuration memory cells must be programmed to configure CLE circuit 10. Of these sixty configuration memory cells, thirty four memory cells store 'state data'. State data is defined as the data stored in the configuration memory cells associated with flip flops 104 and 105 and function generators 101 and 102 (as the function generators store state information when configured as user RALM as described in reference to FIG. 5).

Figure 4:
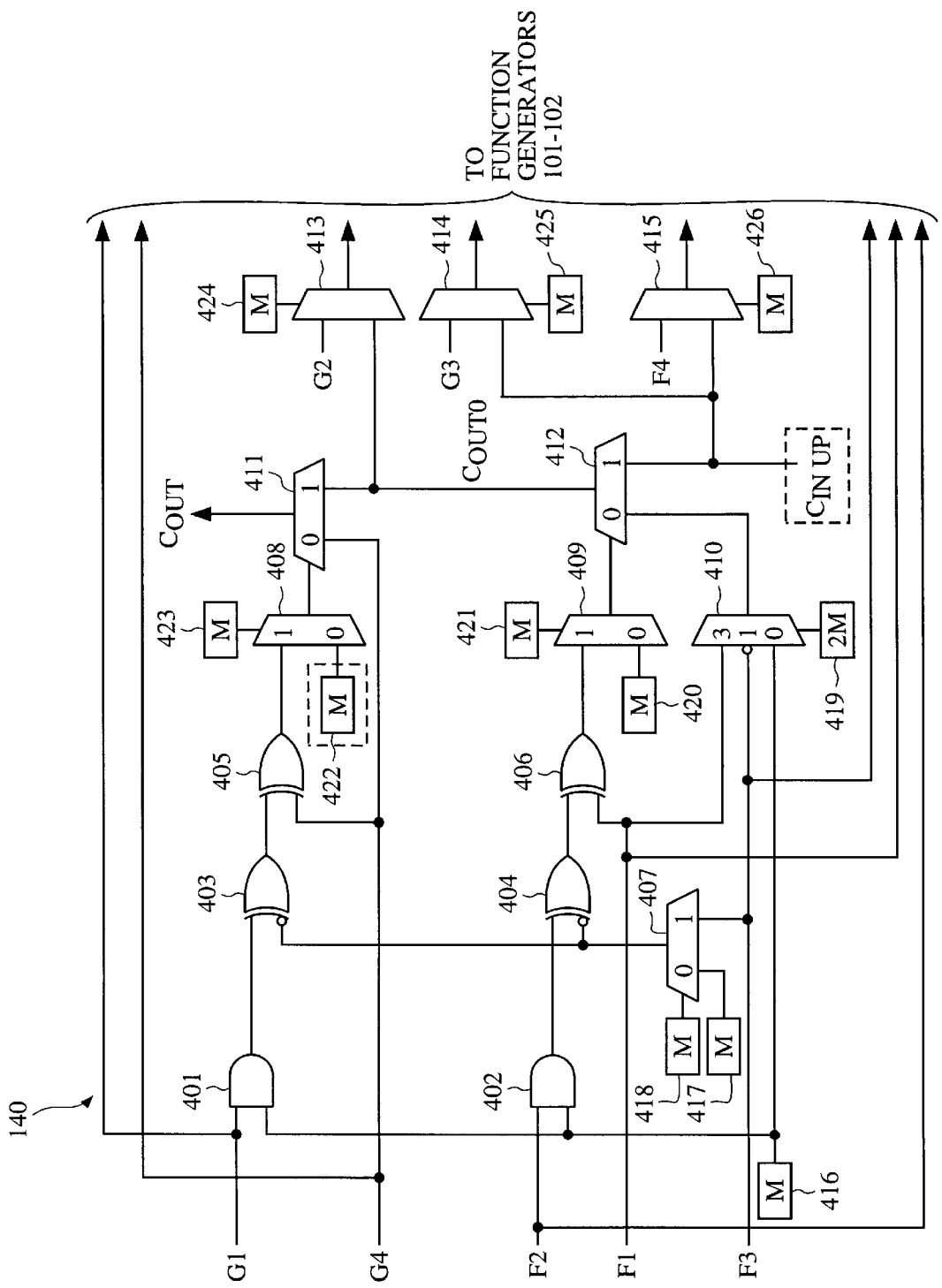
FIG. 4 is a schematic diagram of a fast carry logic circuit which can be connected to the CLE circuit of FIG. 3.

CLE circuit 10 can additionally include circuitry which can be configured to implement fast carry logic (FIG. 4).

FIG. 4 is a schematic diagram of a fast carry logic circuit 140 which is connected to function generators 101–102. Fast carry logic circuit 140 includes AND gates 401–402, exclusive OR gates 403–406, multiplexers 407–415 and configuration memory cells 416–426. Twelve configuration memory cells must be programmed to configure fast carry logic circuit 140 (configuration memory cell 419 stores 2-bits). The operation of fast carry logic circuit 140 is described in more detail in 'The Programmable Logic Data Book', (1996) pp. 4–21 to 4–23, which is available from Xilinx, Inc.

Figure 5:
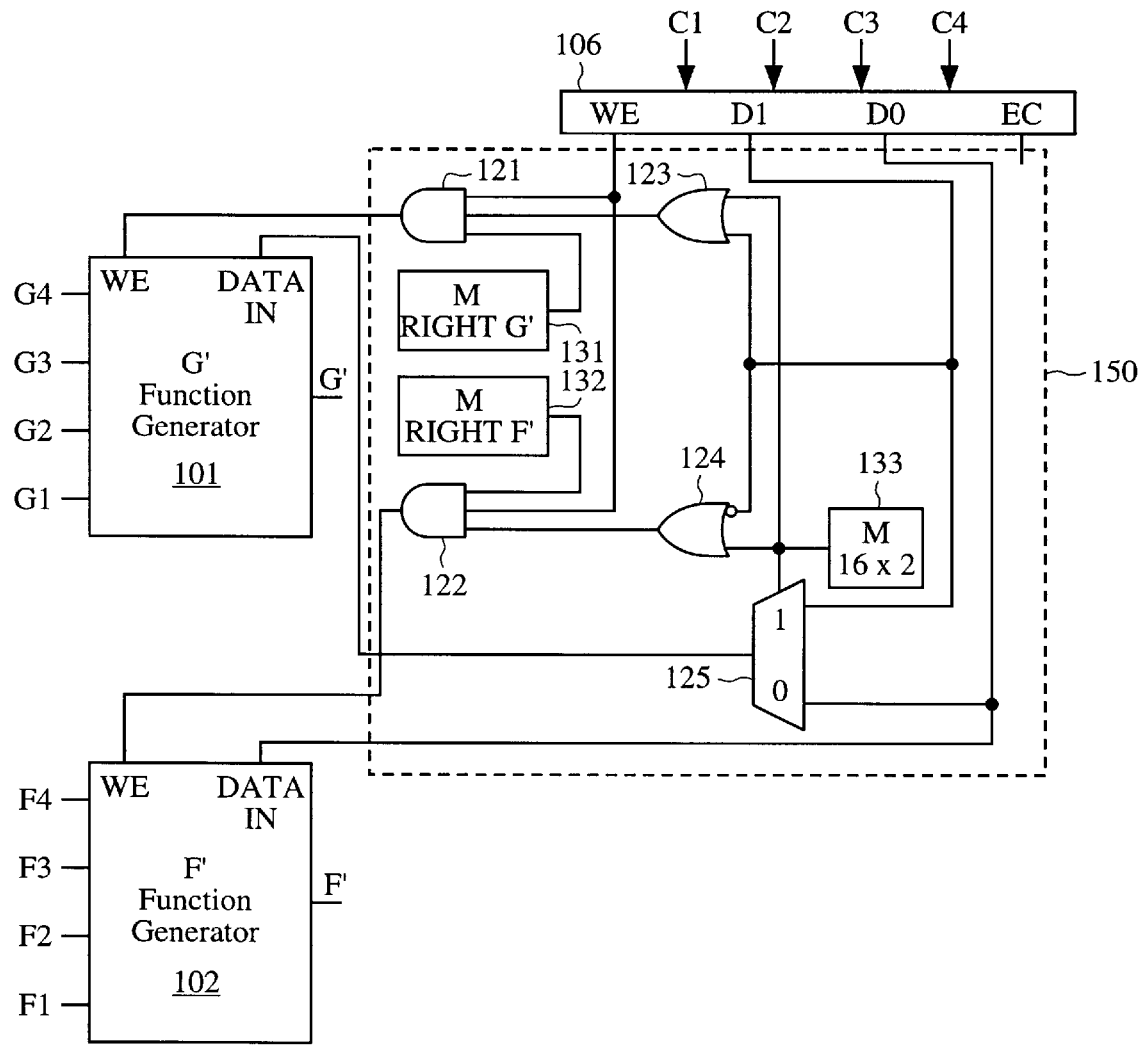
FIG. 5 is a schematic diagram of a user RAM configuration circuit which enables the CLE circuit of FIG. 3 to be configured as a user-accessible random access memory.

FIG. 5 is a schematic diagram of a user RAM configuration circuit 150 which enables the function generators 101 and 102 of CLE circuit 10 to be configured as a user-accessible random access memory (user RAM), such that data can be written to and read from the function generators 101 and 102 during normal logical operation of the FPGA 1. User RAM configuration circuit 150 includes AND gates 121–122, OR gates 123–124, multiplexer 125 and configuration memory cells 131–133. In general, the F1–F4 and G1–G4 input terminals of function generators 101 and 102 act as address lines to select particular memory cells in the function generators. The functionality of the control input signals C1–C4 are modified such that the H1, DIN and S/R lines become the write enable (WE) and data (D1, D0) lines for the user RAM. The user RM control circuit 150 is described in more detail in 'The Programmable Logic Data Book', (1994) pp. 2–20 to 2–21, available from Xilinx, Inc. (Note that the Xilinx Data Books refer to CLE circuit 10 as a CLB.) The user RAM control circuit 150 is configured by programming three configuration memory cells.

To summarize, the configuration of CLB 100 is defined by the data stored in approximately 564 configuration memory cells. Of these 564 configuration memory cells, 34 store state data and 530 store configuration data. In the past, these configuration memory cells have been programmed in several different manners. Typically, the configuration memory cells are sequentially programmed in response to an externally provided configuration bit stream. Newer technology, such as that described in U.S. Pat. No. 5,600,263, teaches that the configuration data and state data for a particular configuration can be stored in a separate memory of the FPGA 1. As previously described, the separate memory is connected in parallel to each of the configuration memory cells, such that an entire set of the configuration data values and state data values can be simultaneously loaded from the separate memory to the configuration memory cells.

In contrast, and as described in more detail below, the present invention provides a configuration cache memory block within each CLB which loads the configuration memory cells over a plurality of clock cycles. By doing so, the routing overhead associated with the configuration cache memory is greatly reduced.

Figure 6:
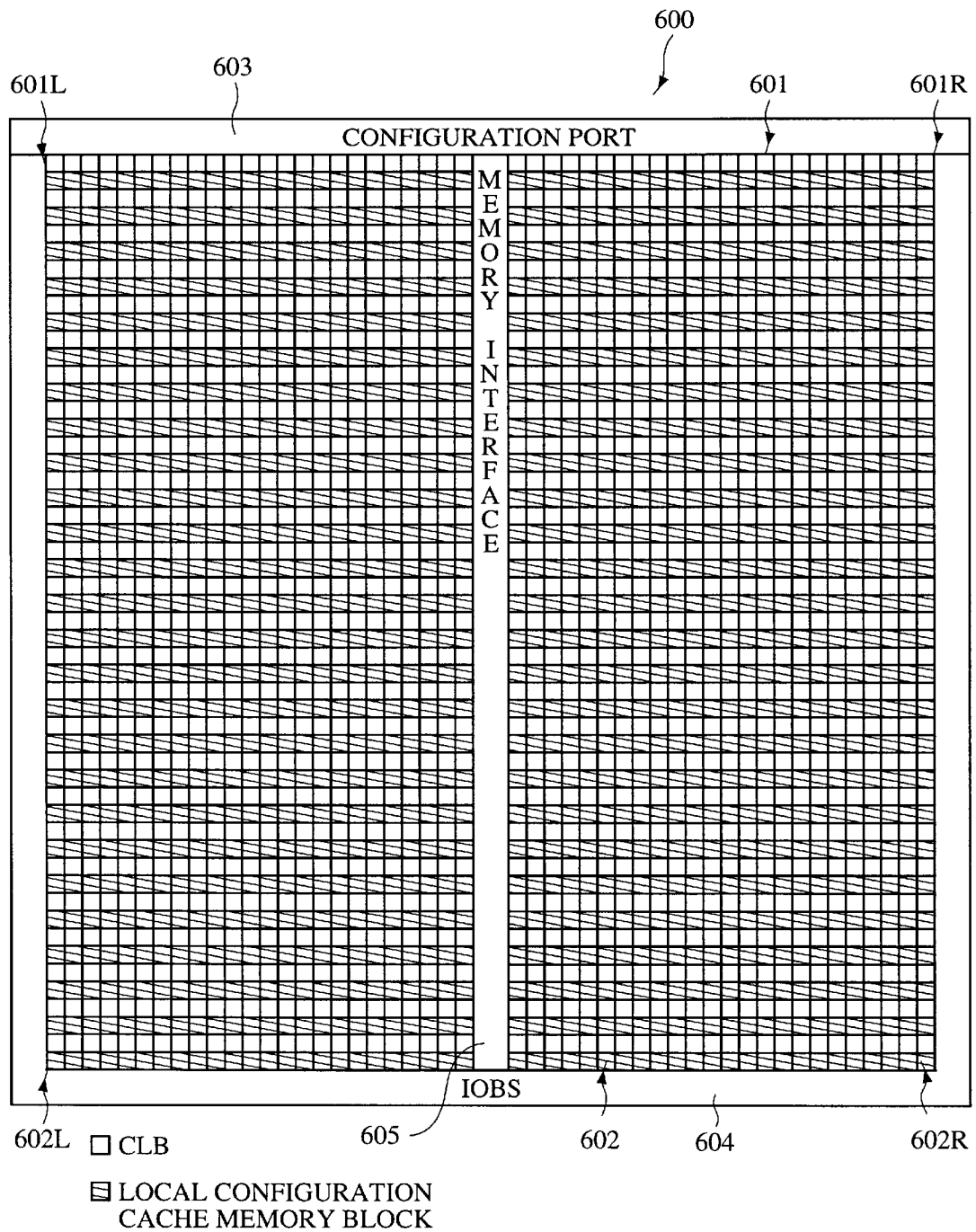
FIG. 6 is a block diagram of an FPGA in accordance with one embodiment of the present invention.

FIG. 6 is a block diagram of an FPGA 600 in accordance with one embodiment of the present invention. FPGA 600 includes a CLB array 601, a configuration cache memory array 602, a configuration port 603, a region of IOBs 604, and a memory interface circuit 605. In the described embodiment, CLB array 601 is made up of 24 rows and 48 columns of XC4000EX CLBs. Thus, each of the CLBs in CLB array 601 includes the circuitry previously described in connection with FIGS. 2–5. Other types of CLBs can also be used, and are considered within the scope of the present invention. CLB array 601 is given a height of 24 CLBs to facilitate 32-bit arithmetic (16 CLBs high), with additional space above and below for control logic being implemented with CLBs located near the top and bottom of this height. CLB array 601 is given a width of 48 CLBs to provide a square die for FPGA 600. Note that each CLB and its associated local configuration cache memory block has a 2:1 aspect ratio.

CLB array 601 is partitioned into a left half-array 601L which is made up of 24 rows and 24 columns of CLBs, and a right half-array 601R which is also made up of 24 rows and 24 columns of CLBs. As described in more detail below, each of the CLB half-arrays 601L and 601R is independently reconfigurable.

Similarly, configuration cache memory array 602 is made up of 24 rows and 48 columns of local configuration cache memory blocks. Configuration cache memory array 602 is partitioned into a left half-array 602L which is made up of 24 rows and 24 columns of local configuration cache memory blocks, and a right half-array 602R which is also made up of 24 rows and 24 columns of local configuration cache memory blocks. The 24 rows of CLB array 601 are interleaved with the 24 rows of configuration cache memory array 602 as illustrated in FIG. 6.

Each of the CLBs in CLB array 601 has a corresponding local configuration cache memory block in configuration cache memory array 602. As described in more detail below, each local configuration cache memory block has the capacity to store the configuration data values and the state data values for four separate configurations of the corresponding CLB.

Figure 7:
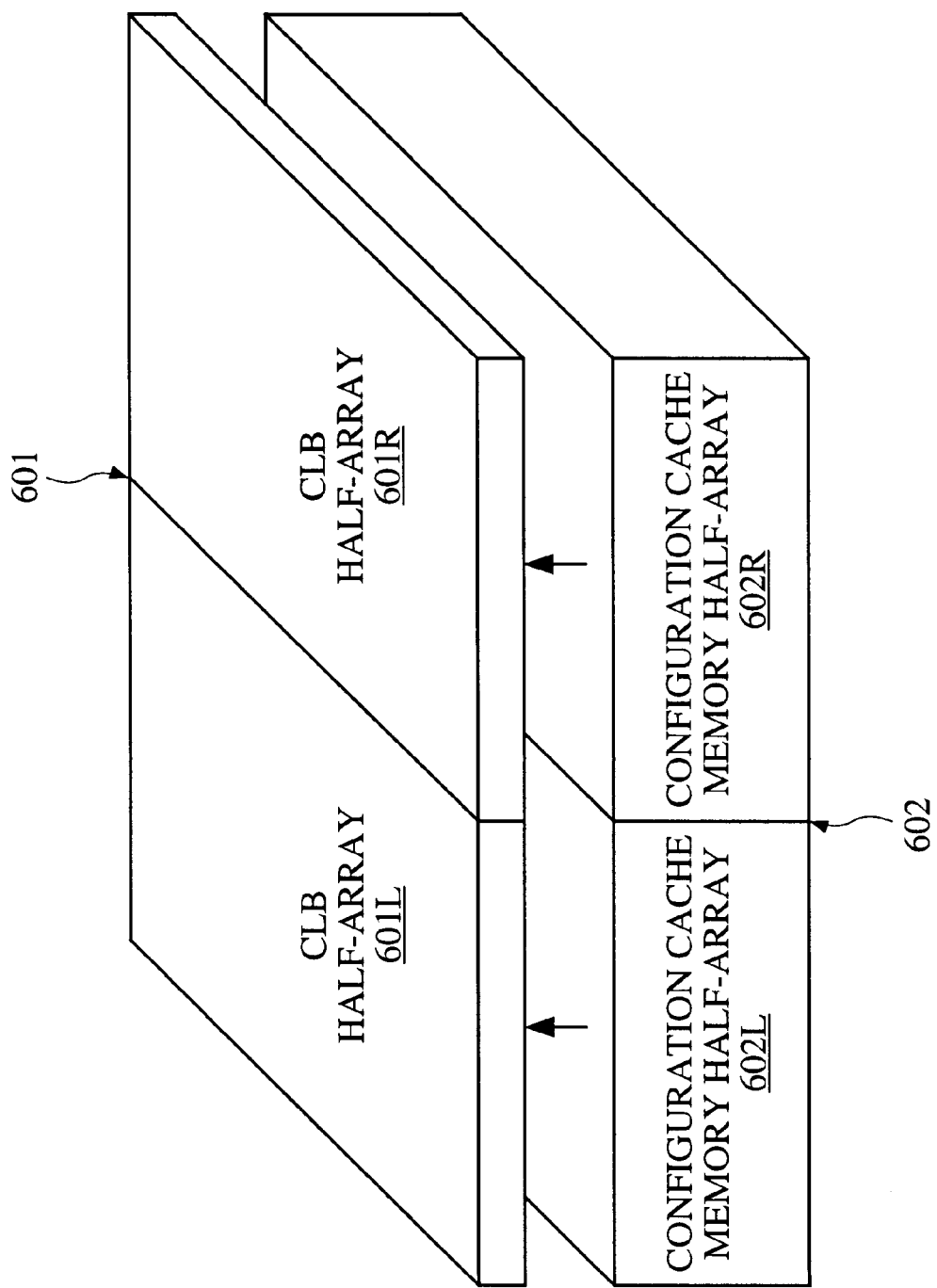
FIG. 7 is a schematic representation of the CLB array and configuration cache memory array of the FPGA of FIG. 6.

FIG. 7 is a schematic representation of CLB array 601 and configuration cache memory array 602. In this representation, the configuration cache memory array 602 is located 'beneath' the CLB array 601. Configuration data and state data are transferred from the configuration cache memory half-arrays 602L and 602R into CLB half-arrays 601L and 601R, respectively. The CLBs in CLB array 601 are interconnected to one another by the programmable interconnect resources of the CLBs (See, e.g., programmable interconnect resources 11 of FIG. 2). As described in more detail below, the configuration cache memory array 602 is typically logically invisible to the CLB array 601 during the normal logical operation of the CLB array 601 (unless the configuration cache memory array 602 is being used as user memory, as described in more detail below).

Figure 8:
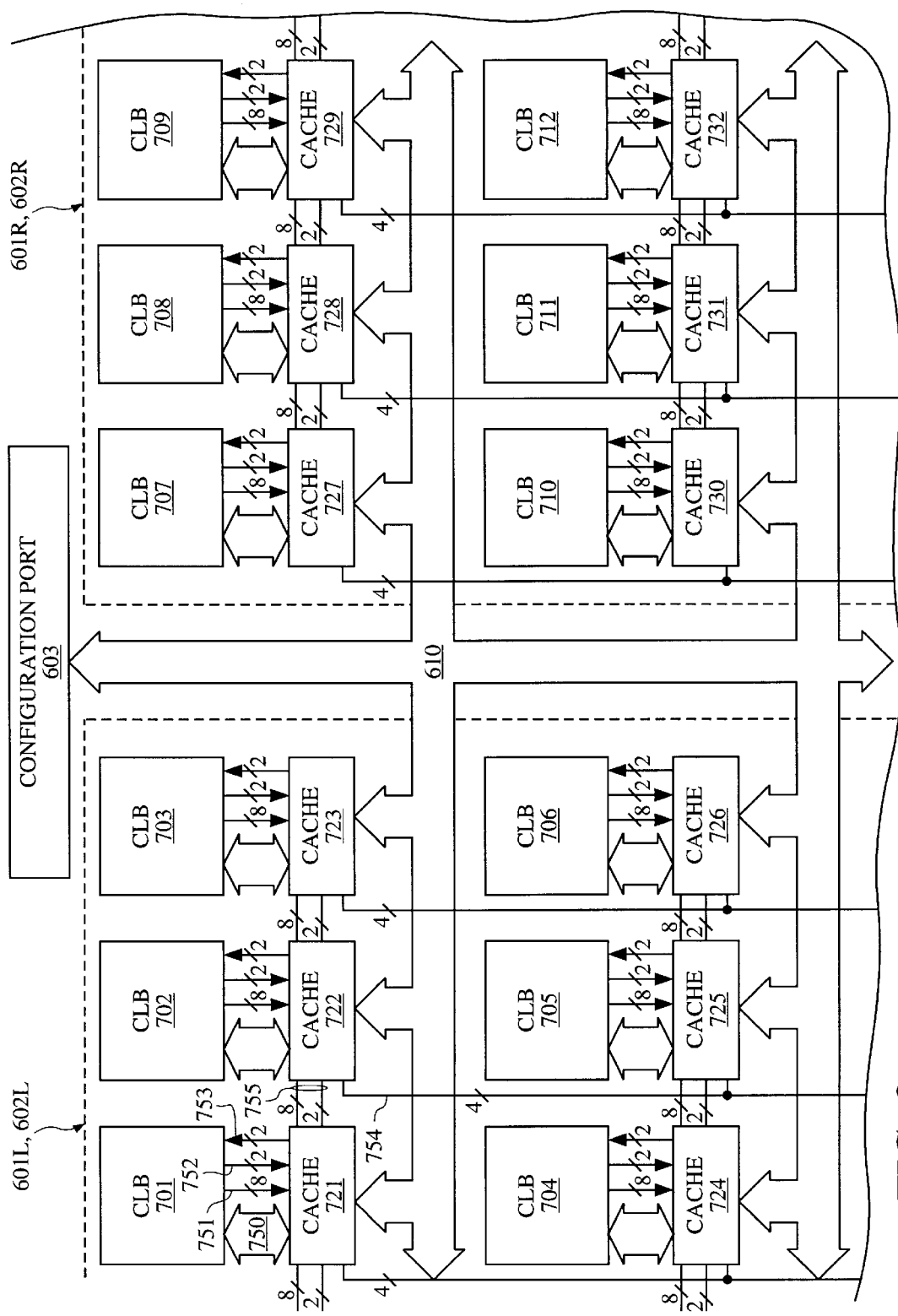
FIG. 8 is a block diagram which illustrates a portion of the FPGA of FIG. 6 in more detail.

FIG. 8 is a block diagram which illustrates a portion of FPGA 600 in more detail. FIG. 8 illustrates configuration port 603, cache configuration bus 610 (which is part of memory interface circuit 605 (FIG. 6)), CLBs 701–712, corresponding local configuration cache memory blocks 721–732, and the local bus structure which exists between each CLB and its corresponding local configuration cache memory block. CLBs 701–706 are part of CLB half-array 601L, and CLBs 707–712 are part of CLB half-array 601R. Similarly, local configuration cache memory blocks 721–726 are part of configuration cache memory half-array 602L, and local configuration cache memory blocks 727–732 are part of configuration cache memory half-array 602R.

Cache configuration bus 610 extends between the left half-arrays 601L, 602L and the right half-arrays 601R, 602R. Each of the local configuration cache memory blocks 721–732 is connected in parallel to cache configuration bus 610. The cache configuration bus 610 is further coupled to configuration port 603, thereby providing an interface between the configuration port 603 and the configuration cache memory array 602. This interface is a random access (read and write) interface between configuration port 603 and configuration cache memory array 602. As a result, configuration cache memory array 602 can be accessed directly by an external processor through configuration port 603. In the described embodiment, the cache configuration bus 610 includes a dedicated data bus which is eight bits wide. Each of the local configuration cache memory blocks 721–732 is assigned a unique access address to enable these local configuration cache memory blocks to be individually addressed by signals transmitted on the cache configuration bus 610. Thus, configuration bus 610 includes a dedicated address bus having a width which is sufficient to carry these cache memory block addresses.

A 48-bit wide bus extends between each of CLBs 701–712 and its corresponding local configuration cache memory block. For example, 48-bit wide bus 750 extends between CLB 701 and local configuration cache memory block 721. As described in more detail below, these 48-bit wide buses are used to transfer configuration data values and state data values from local configuration cache memory blocks 721–732 to the corresponding CLBs 701–712. An 8-bit address bus also extends from each of CLBs 701–712 to its corresponding local configuration cache memory block. For example, 8-bit address bus 751 extends from CLB 701 to local configuration cache memory block 721. As described in more detail below, these 8-bit wide address buses are used to transfer memory addresses from CLBs 701–712 to local configuration cache memory blocks 721–732. A pair of 2-bit data buses also extends between each of CLBs 701–712 and its corresponding local configuration cache memory block. For example, 2-bit data bus 752 extends from CLB 701 to local configuration cache memory block 721, and 2-bit data bus 753 extends from local configuration cache memory block 721 to CLB 701. As described in more detail below, these 2-bit wide data buses are used to transfer data between CLBs 701–712 and local configuration cache memory blocks 721–732. Finally, expansion buses, such as expansion buses 754 and 755, extend between the local configuration cache memory blocks 721–732 as illustrated. As described in more detail below, the 4-bit wide expansion buses 754 and the 10-bit wide (8-bit+2-bit) expansion buses 755 are used to join local configuration cache memory blocks to form a larger user memory.

Figure 9:
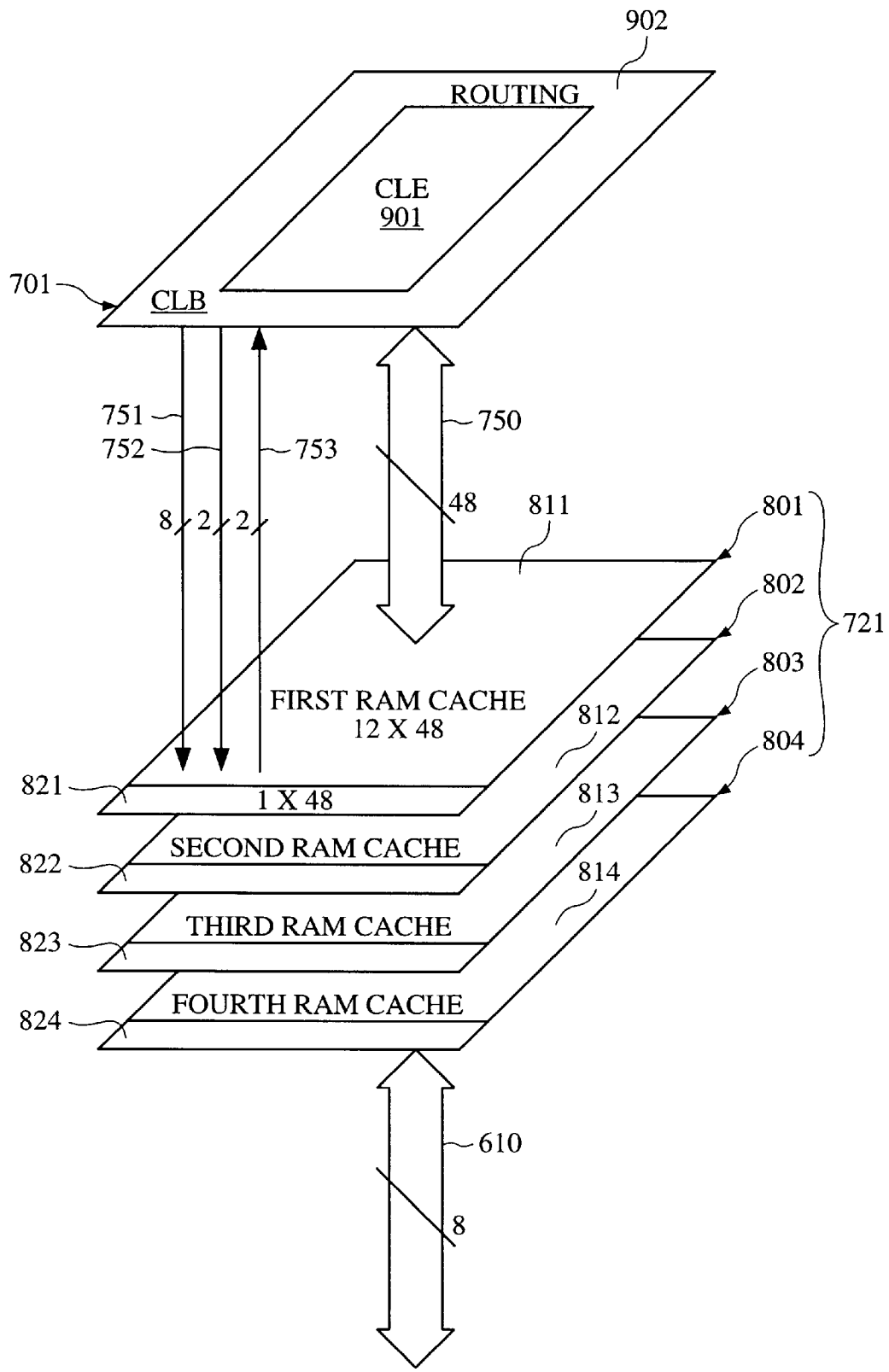
FIG. 9 is a block diagram illustrating a CLB and local cache memory block of the FPGA of FIG. 6 in more detail.

FIG. 9 is a block diagram illustrating CLB 701 and local cache memory block 721 in more detail. CLB 701 and local cache memory block 721 are representative of the other CLBs and local cache memory blocks of FPGA 600. CLB 701 includes CLE circuit 901 and programmable interconnect resources 902. CLB 701 is substantially identical to CLB 100 (FIGS. 2–5). Thus, CLE circuit 901 and programmable interconnect resources 902 are substantially identical to the previously described CLE circuit 10 and programmable interconnect resources 11. As a result, CLB 701 includes approximately 564 configuration memory cells which must be programmed in order to configure CLB 701.

Local configuration cache memory block 721 is partitioned into four local cache memories 801–804. Each of the local cache memories 801–804 has a width of 48 columns and a depth of 13 rows. In other embodiments, the local cache memories 801–804 can have other dimensions. Each of the local cache memories 801–804 is further partitioned into a configuration data cache memory and a state data cache memory. Thus, local cache memory 801 is partitioned into configuration data cache memory 811 and state data cache memory 821. Local cache memory 802 is partitioned into configuration data cache memory 812 and state data cache memory 822. Local cache memory 803 is partitioned into configuration data cache memory 813 and state data cache memory 823. Finally, local cache memory 804 is partitioned into configuration data cache memory 814 and state data cache memory 824.

Each of the configuration data cache memories 811–814 is 48 columns wide by 12 rows deep. Each of the configuration data cache memories 811–814 stores the 530 configuration data values required to configure CLB 701. These 530 configuration data values are stored as 12 words, each having a width of 48 bits. Not all of the 12×48 bits are used to store configuration data values. Unused bits can be used for other purposes, such as storing save and restore addresses, as described in more detail below.

Each of the state data cache memories 821–824 is 48 columns wide by 1 row deep. Each of the state data cache memories 821–824 stores the 34 state data values required to restore the status of the function generators and flip flops of CLB 701 (fourteen of the 48 columns of each state data cache memory are not used to store state data values).

The entries of the local cache memories 801–804 which are not used to store configuration data values or state data values can be used to store a save address and a restore address. The save address indicates the local cache memory to which the state data values are to be saved when the configuration of CLB 701 is modified, and the restore address indicates the local cache memory from which the state data values are to be restored when the configuration of CLB 701 is modified.

For example, a 2-bit save address can be stored at a first predetermined location within local cache memory 801, and a 2-bit restore address can be stored at a second predetermined location within local cache memory 801. The 2-bit save address identifies the local cache memory to which the current state data values will be saved when CLB 701 is reconfigured from the configuration defined by local cache memory 801 to another configuration. The 2-bit save address can identify any one of the four local cache memories 801–804.

In one example, the 2-bit save addresses of '00', '01', '10' and '11' identify local cache memories 801, 802, 803 and 804, respectively. In such an example, suppose that the 2-bit save address stored in local cache memory 801 has a value of '10', thereby identifying local cache memory 803. Further suppose that the configuration data values, including the save address bits, associated with local cache memory 801 are currently used to configure CLB 701. When the CLB 701 is to be reconfigured with configuration data values from another one of local cache memories 802–804, the current state data values stored by CLB 701 will be stored to state data cache memory 823 of local cache memory 803 (rather than state data cache memory 821 of local cache memory 801) in response to the 2-bit save address having a '10' value.

In a similar manner, the 2-bit restore address identifies the local cache memory from which the current state data values will be retrieved when CLB 701 is configured in response to configuration data values stored in a particular local cache memory. The 2-bit restore address can identify any one of the four local cache memories 801–804.

In one example, the 2-bit restore addresses of '00', '01', '10' and '11' identify local cache memories 801, 802, 803 and 804, respectively. In such an example, suppose that the 2-bit restore address stored in local cache memory 801 has a value of '11', thereby identifying local cache memory 804. Further suppose that the configuration data values, including the restore address, associated with local cache memory 801 are currently being loaded to configure CLB 701. When restoring the state data values to CLB 701, the state data values stored in state data cache memory 824 of local cache memory 804 will be loaded to configure CLB 701 in response to the 2-bit restore address having a '11' value (rather than the state data values stored in state data cache memory 821 of local cache memory 801).

Enabling the state data values to be saved and restored from different local cache memories as described above, advantageously expands the configuration and reconfiguration possibilities of CLB 701.

In an alternative embodiment, one or more of the local cache memories 801–804 are used to store more than one set of state data values. For example, the thirteen rows of local cache memory 804 can be used to store thirteen different sets of state data values. That is, the configuration data cache memory 814 of local cache memory 804 is used to store state data values instead of configuration data values. This provides a larger capacity for storing state data values. In the previously described example, there would be sixteen accessible sets of state data values (i.e., 1 set of state data values in each of local cache memories 801–803 and 13 sets of state data values in local cache memory 804). Each of these sixteen sets of state data values could be accessed by each of local cache memories 801–803 by implementing a 4-bit save address and a 4-bit restore address within each of local cache memories 801–803 in the manner previously described. All of the addresses of the local cache memories 801–804 are available to store state data values (up to 52 sets of state data values).

In accordance with one embodiment of the invention, CLB 701 is reconfigured from local cache memory 801 as described in detail below. It is understood that CLB 701 can also be reconfigured in a similar manner from local cache memories 802–804. That is, any one of the four local cache memories 801–804 can be selected to reconfigure CLB 701. It is further understood that all of the CLBs in CLB half-array 601L (FIG. 6) are reconfigured at the same time as (i.e., in parallel with) CLB 701. All of the CLBs in CLB half-array 601R (FIG. 6) can also be configured at the same time, although this is not necessary. The reconfiguration of CLB half-array 601L and the reconfiguration of CLB half-array 601R are independently controllable events.

CLB 701 is reconfigured using a 4-step, 15-cycle process. In the first step, which takes one cycle, the 34 bits of state data currently stored in the function generators and flip flops of CLB 701 are written to state data cache memory 821 (i.e., the 13th row of local cache memory 801). (This example assumes that the save address of the current configuration identifies local cache memory 801.) In the second step, which also takes one cycle, all of the configuration memory cells of CLB 701 are cleared to avoid contention during the subsequent reconfiguration steps. In the third step, which takes twelve cycles, the configuration data values stored in configuration data cache memory 811 are transferred to CLB 701 over the 48-bit bus 750 (FIG. 8). More specifically, the twelve rows of configuration data cache memory 811 are sequentially loaded to the configuration memory cells of CLB 701 during 12 consecutive cycles. That is, one row of configuration data cache memory 811 is written to CLB 701 per cycle. This transfer is completed, for example, by using conventional address sequencing circuits to access both data cache memory 811 and the configuration memory cells of CLB 701. In the fourth step, which takes one cycle, the state data values stored in state data cache memory 821 are transferred to the function generators and flip flops of CLB 701 over the 48-bit bus 750 (FIG. 8). (This example assumes that the restore address of the loaded configuration identifies state data cache memory 821 of local cache memory 801.) Assuming a transfer rate of 60 MHz, the reconfiguration time is approximately 250 nsec.

The first step (saving the state data values) and the fourth step (restoring the state data values) are performed using configuration dependent addresses, thereby enabling the state data values to be shared among the four possible configurations as previously described. For example, in the previous example, the state data values could have been saved in any one of the state data cache memories 821–824 in the first step, even though CLB 701 was receiving configuration data values from configuration data cache memory 811. Similarly, the state data values could have been restored from any one of the state data cache memories 821–824 during the fourth step, even though CLB 701 was receiving configuration data values from configuration data cache memory 811.

The configuration data values and state data values which are stored in configuration cache memory array 602 (FIGS. 7 and 8) are initially loaded into the configuration cache memory array 602 from an external source, such as a control processor, through the configuration port 603 and the memory interface circuit 605. This facilitates a single cycle transfer of state data values as follows. First, the state data values are written from the configuration port 603 to the locations identified by the current restore addresses within the local cache memories. These state data values are then immediately restored (i.e., written to the associated CLBs) without reconfiguring the associated CLBs.

Moreover, because the configuration cache memory array 602 remains coupled to the configuration port 603 and the memory interface circuit 605 during normal operation of FPGA 600, an external device can access the configuration and state data values stored in configuration cache memory array 602 during normal operation of FPGA 600. Note that in order to read the current information from the memory cache, the values in the cache must be updated using a save operation (that can occur without reconfiguring the associated CLE).

256×2 RAM

Figure 10:
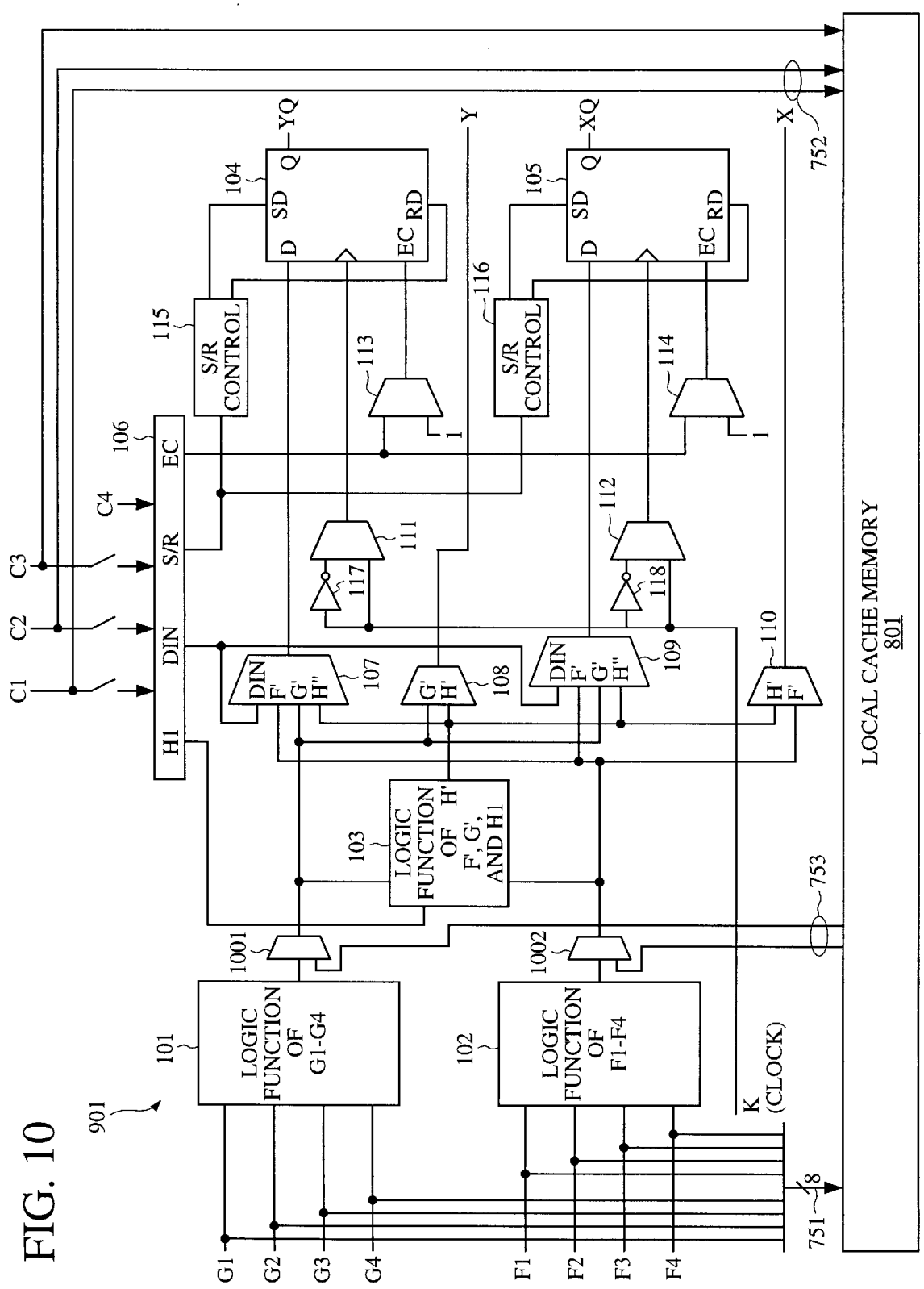
FIG. 10 is a block diagram illustrating a CLE circuit and a local cache memory configured as user RAM.

In an alternate embodiment of the present invention, any one or more of the local cache memories 801–804 can be modified to operate as a 256×2 bit random access memory. FIG. 10 is a block diagram illustrating the interconnections provided between CLE circuit 901 and local cache memory 801 to achieve a 256×2 RAM. Input terminals F1–F4 and G1–G4 of the CLB 701 are connected to address bus 751 as illustrated. Address bus 751 is selectively coupled to local cache memory 801 by programming a plurality of programmable interconnect points (not shown). These programmable interconnection points are programmed by corresponding configuration memory cells. These memory cells, in turn, are loaded with values stored in the configuration cache memory. In this manner, the input signals F1–F4 and G1–G4 are provided to local cache memory 801 as an 8-bit address signal. This address signal is used by conventional address decoder circuitry within local cache memory 801 to address one of 256 addresses within local cache memory 801. Each of the 256 addresses is associated with a 2-bit data value.

To write a data value to local cache memory 801, a 2-bit data value is routed from the lines providing the C1 and C2 input signals to local cache memory 801 on bus 752, and a write enable signal is routed from the line providing the C3 input signal to local cache memory 801 as illustrated. The 2-bit data value provided on bus 752 is written to local cache memory 801 at the address defined by the input signals F1–F4 and G1–G4. In this manner, 2-bit data values can be written to each of the 256 addresses in local cache memory 801. Note that in another embodiment, using programmable switch 106, internal signals H1, DIN, and S/R become signals WE, D1, and D0, respectively (see FIG. 5).

To read a data value from local cache memory 801, the write enable signal on input terminal C3 is de-asserted. In response, local cache memory 801 provides the 2-bit data value corresponding with the current address signal to multiplexers 1001 and 1002 on bus 753 as illustrated. Multiplexers 1001 and 1002 are programmed (by configuration memory cells) to pass the 2-bit data value from local cache memory 801. The 2-bit output data value can be read out of CLE circuit 901 through the X and Y output terminals or through flip flops 104 and 105 in the same manner as the normal output signals F' and G' of function generators 101 and 102. Note that when local cache memory 801 is not operating as a 256×2 RAM, multiplexers 1001 and 1002 are programmed to pass the output signals of function generators 101 and 102, respectively.

Each CLB half-array 601L, 601R (FIGS. 7 and 8) has a capacity of 36 Kbytes per configuration (256×2 bits per local cache memory×1 byte/8 bits×24×24 local cache memories per CLB half-array), with a maximum of 288 Kbytes available for all four configurations of both half-arrays (36 Kbytes×4 configurations per CLB half-array×2 CLB half-arrays per FPGA).

The 256×2 RAM can be expanded by including one or more of the local cache memories 802–804, in addition to local cache memory 801. This RAM can further be expanded by including one or more of the local configuration cache memory blocks 722–732, in addition to local configuration cache memory block 721.

Figure 11:
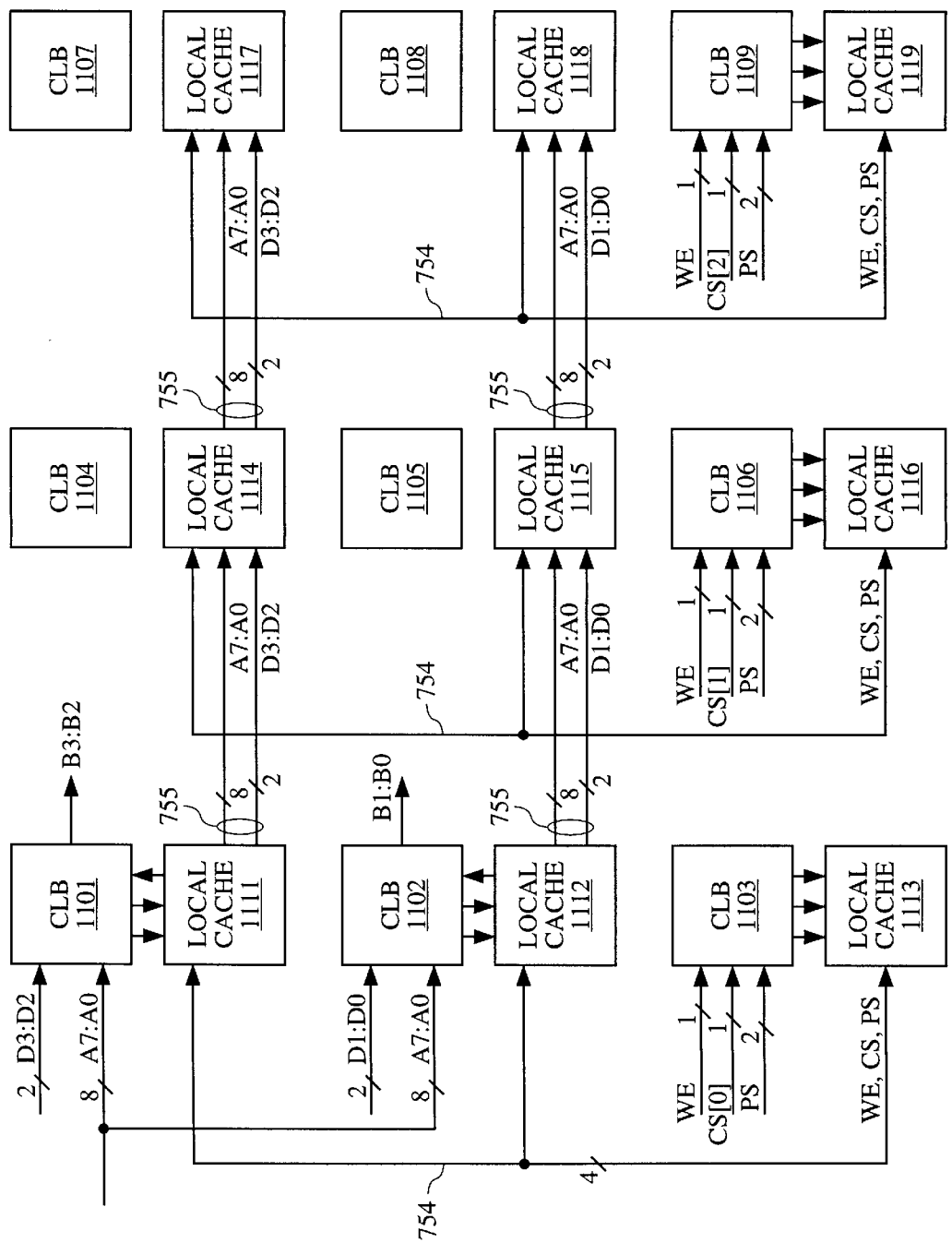
FIG. 11 is a block diagram of a plurality of CLBs and local configuration cache memory blocks configured as user RAM.

FIG. 11 is a block diagram which illustrates a 3K×4 RAM which is formed by such expansion. The RAM includes nine CLBs 1101–1109 and their corresponding local cache memories 1111–1119. CLBs 1103, 1106 and 1109 are used to control the operation of the RAM, while local cache memory blocks 1111–1112, 1114–1115 and 1117–1118 provide the memory storage cells of the RAM. The local cache memory blocks 1111–1112, 1114–1115, and 1117–1118 are arranged in three columns as illustrated, with each column being controlled by a corresponding one of the CLBs 1103, 1106 and 1109.

Each of CLBs 1103, 1106 and 1109 receives a write enable WE signal, a column select CS signal and a plane select PS signal. Each of the three CLBs 1103, 1106 and 1109 receives a corresponding 1-bit column select signal CS[0], CS[1] or CS[2]. At most, one of these column select signals is asserted at any given time, thereby selecting one of the three columns. The PS signal is a 2-bit signal which is provided to each of the three CLBs 1103, 1106 and 1109 to select one of the four local cache memories within each of the local cache memory blocks 1111–1112, 1114–1115 and 1117–1118. At any given time, the PS signal enables one of the four local cache memories within one of the three columns. The WE signal is a 1 bit write enable signal which is provided to each of the three CLBs 1103, 1106 and 1109 to select a write (or read) operation within the local cache memory blocks 1111–1112, 1114–1115 and 1117–1118.

The CS, PS and WE signals are routed through CLBs 1103, 1106 and 1109 to local cache memories 1113, 1116 and 1119, respectively using bus 751 (FIG. 10). Local cache memories 1113, 1116 and 1119, in turn, route these CS, PS and WE signals to expansion buses 754. Expansion buses 754 route these signals to the local cache memories 1111–1112, 1114–1115 and 1117–1118 as illustrated. In response to these signals, local cache memories determine whether they are to be accessed. For example, if the WE signal is asserted, then local cache memories 1111–1112, 1114–1115 and 1117–1118 are informed that the current operation is a write operation. If the CS[0] signal is asserted, and CS[1] and CS[2] signals are not asserted, then local cache memories 1111 and 1112 are informed that they are being selected for the write operation. If the PS signal has a value of '00', then local cache memories 1111 and 1112 are informed that a particular one (e.g., the first) of the four planes of 256×2 memory is selected for the write operation.

The address and data values are provided to the 3K×4 memory through CLBs 1101 and 1102. CLB 1101 and local cache memory 1111 are configured in the same manner as previously described for CLB 901 and local cache memory 801 in FIG. 10. CLB 1102 and local cache memory 1112 are configured in the same manner as CLB 1101 and local cache memory 1111. Thus, CLB 1101 is coupled to receive address signals A7:A0 and data signals D3:D2. Similarly, CLB 1102 is coupled to receive address signals A7:A0 and data signals DL:D0. CLBs 1101 and 1102 provide data output signals B3:B2 and B1:B0, respectively.

The address signals A7:A0 and data signals D3:D2 received by CLB 1101 are routed to local cache memory 1111 in the manner previously described in connection with FIG. 10. In addition, these address signals A7:A0 and data signals D3:D2 are routed to local cache memories 1114 and 1117 on expansion buses 755. In a similar manner, expansion buses 755 are used to route data values read from local cache memories 1114 and 1117 back to CLB 1101. In this manner, expansion buses 755 allow all address signals and data signals for local cache memories 1111, 1114 and 1117 to be routed through CLB 1101. As a result, CLBs 1104 and 1107 are free to perform other functions.

Similarly, the address signals A7:A0 and data signals D1:D0 received by CLB 1102 are routed to local cache memory 1112 in the manner previously described in connection with FIG. 10. In addition, these address signals A7:A0 and data signals D1:D0 are routed to local cache memories 1115 and 1118 on expansion buses 755. In a similar manner, expansion buses 755 are used to route data values read from local cache memories 1115 and 1118 back to CLB 1102. In this manner, expansion buses 755 allow all address signals and data signals for local cache memories 1112, 1115 and 1118 to be routed through CLB 1102. As a result, CLBs 1105 and 1108 are free to perform other functions.

It is important to note that expansion buses 754 and 755 are configurable, such that user RAMS of different depths and widths can be constructed. For example, the connection from address bus 751 to expansion bus 755 is configurable such that address bus 751 may or may not connect to expansion bus 755 within local configuration cache memory block 721. In addition, the continuation of the expansion bus 755 along the horizontal direction is configurable, thereby determining the width of the resulting RAM array. Similarly, the connections from expansion bus 754 to the various CLBs and the local cache memories are configurable (as is the continuation of expansion bus 756 in the vertical direction), thereby allowing the height of the resulting RAM array to be programmably selected.

Figure 12:
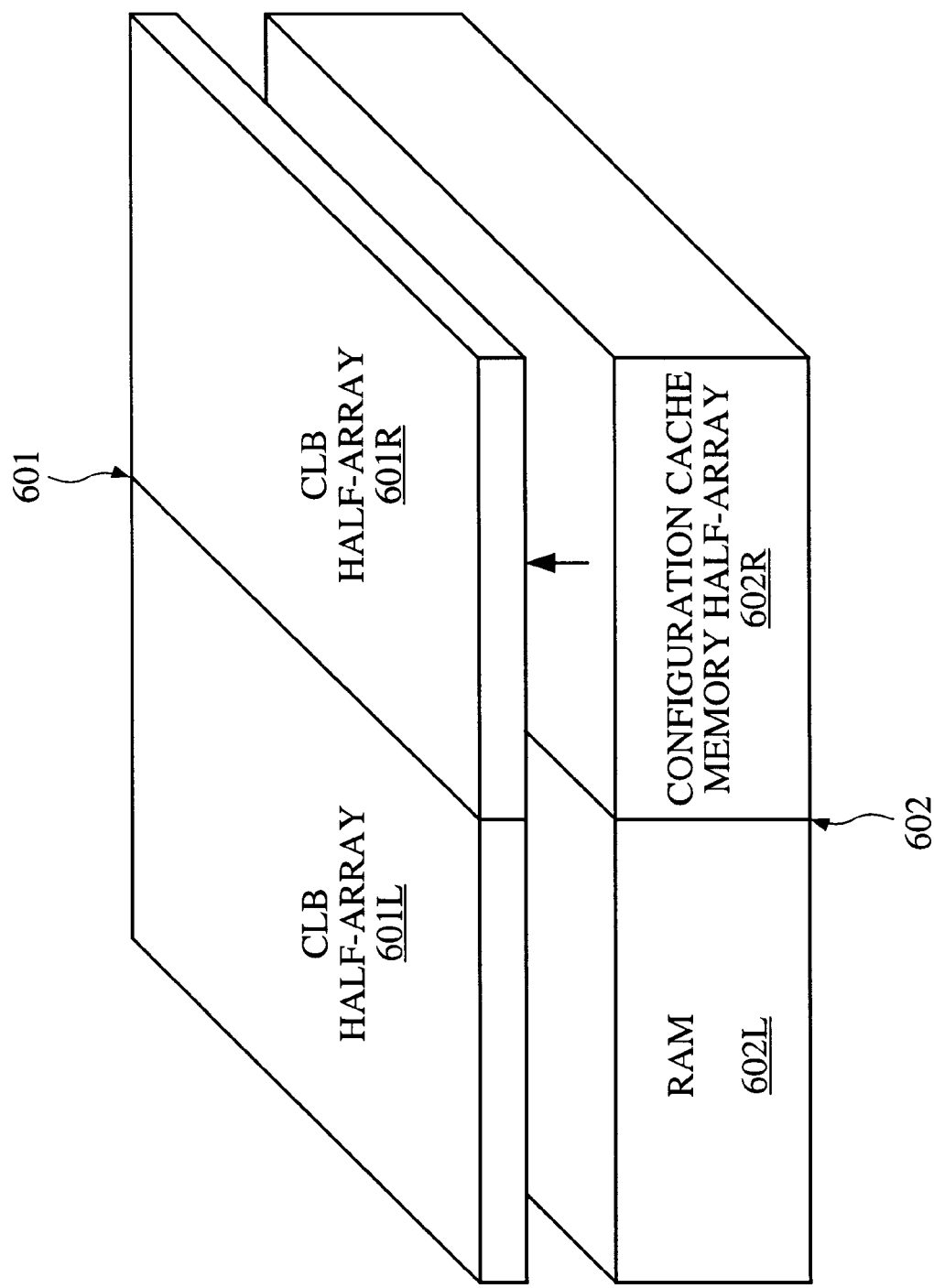
FIG. 12 is a block diagram of an FPGA which uses one configuration cache memory half array to store configuration data and another configuration cache memory half array as user RAM.

In yet another embodiment of the present invention, the configuration cache memory half-arrays 602L and 602R can be independently controlled such that one of the configuration cache memory half arrays is used as a configuration cache memory which stores configuration data values and state data values for reconfiguring the corresponding CLB half-array (see, FIGS. 7–9), and the other one of the configuration cache memory half arrays is used as an independent random access memory (see, FIGS. 10–11). FIG. 12 is a schematic representation of this embodiment, which illustrates configuration cache memory half-array 602R being used as a configuration cache memory for CLB half-array 601R, and configuration cache memory half-array 602L being used as a RAM. The configuration of CLB half-array 601L is fixed in this embodiment. This hybrid use advantageously provides operating flexibility to the FPGA 600. RAM half-array 602L can also be accessed through memory interface 605 and configuration port 603. Memory interface 605 (FIG. 6) would also be accessible to the CLB half array 601L.

Figure 13:
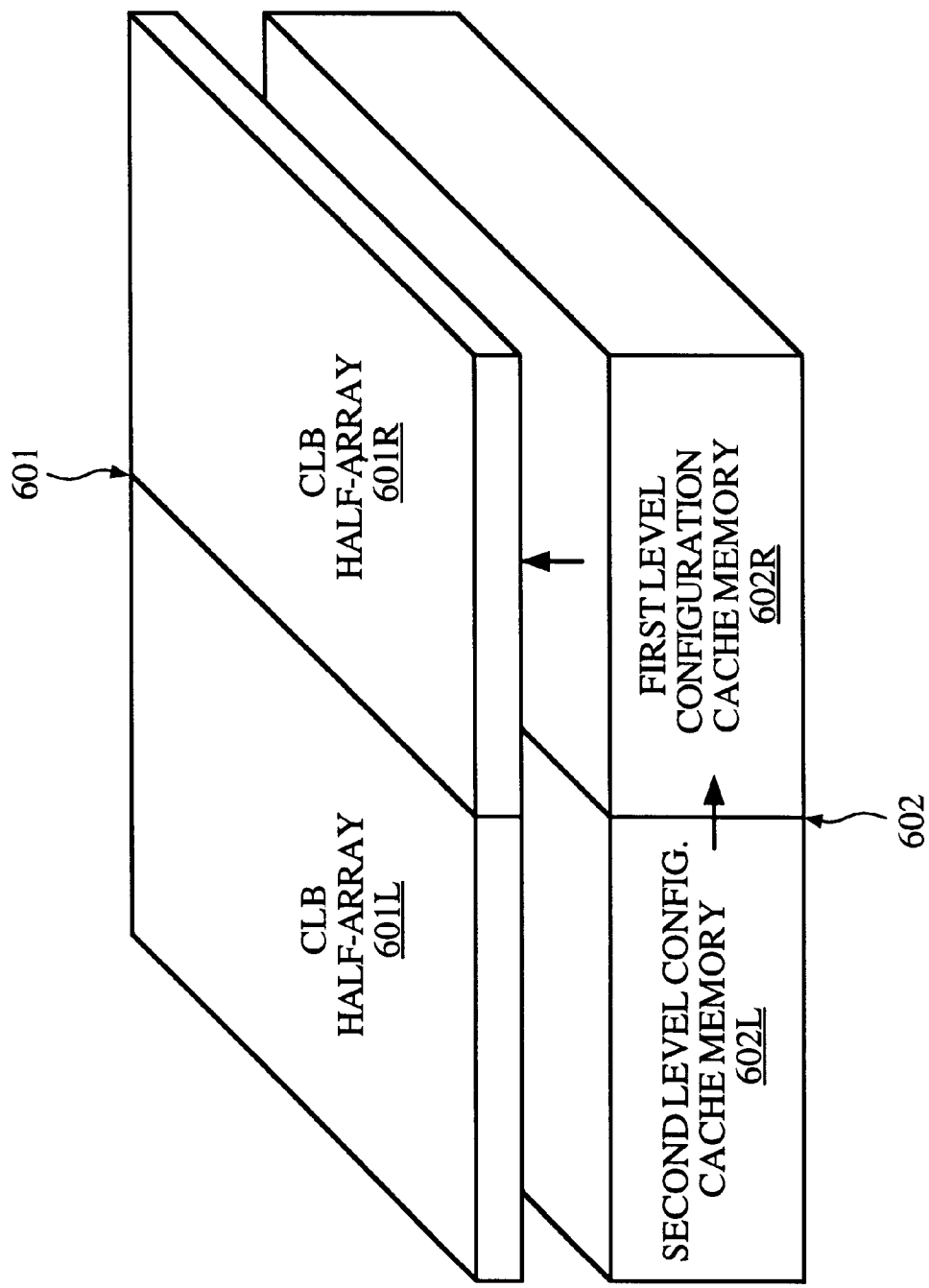
FIG. 13 a block diagram of an FPGA which uses one configuration cache memory half array as a first level configuration cache memory and another configuration cache memory half array as a second level configuration cache memory.

In yet another embodiment, one of the configuration cache memory half-arrays 602L and 602R is used as first level configuration cache memory, and the other one of the configuration cache memory half-arrays 602L and 602R is used as a second level configuration cache. FIG. 13 is a schematic representation of this embodiment, which illustrates configuration cache memory half-array 602R being used as a first level configuration cache memory for CLB half array 601R, and configuration cache memory half-array 602L being used as a second level carray 601R. The he memory for CLB half array 601R. The configuration of CLB half-array 601L is fixed in this embodiment. If the configuration data required by CLB half-array 601R resides in the second level configuration cache memory (i.e., configuration cache memory half-array 602L), then this configuration data is transferred from the second level configuration cache memory to the first level configuration cache memory (i.e., configuration cache memory half array 602R) through the memory interface circuit 605. In making this transfer, one of the sets of configuration data previously stored in the first level configuration cache memory is overwritten with the set of configuration data transferred from the second level configuration cache memory. The transfer of a set of configuration data from the second level configuration cache memory to the first level configuration cache memory can be performed in approximately 50 microseconds by using all of the buses between the CLB rows in parallel. The transferred set of configuration data is then transferred from the first level configuration cache memory to CLB half-array 601R. In this manner, the two configuration cache memory half-arrays 602L and 602R can store up to eight sets of configuration data for one of the CLB half-arrays 601L or 601R.

The previously described FPGA is useful in various applications, including those which implement dynamic configuration, virtual logic, reconfigurable co-processing, and reconfigurable computing.

Figure 14:
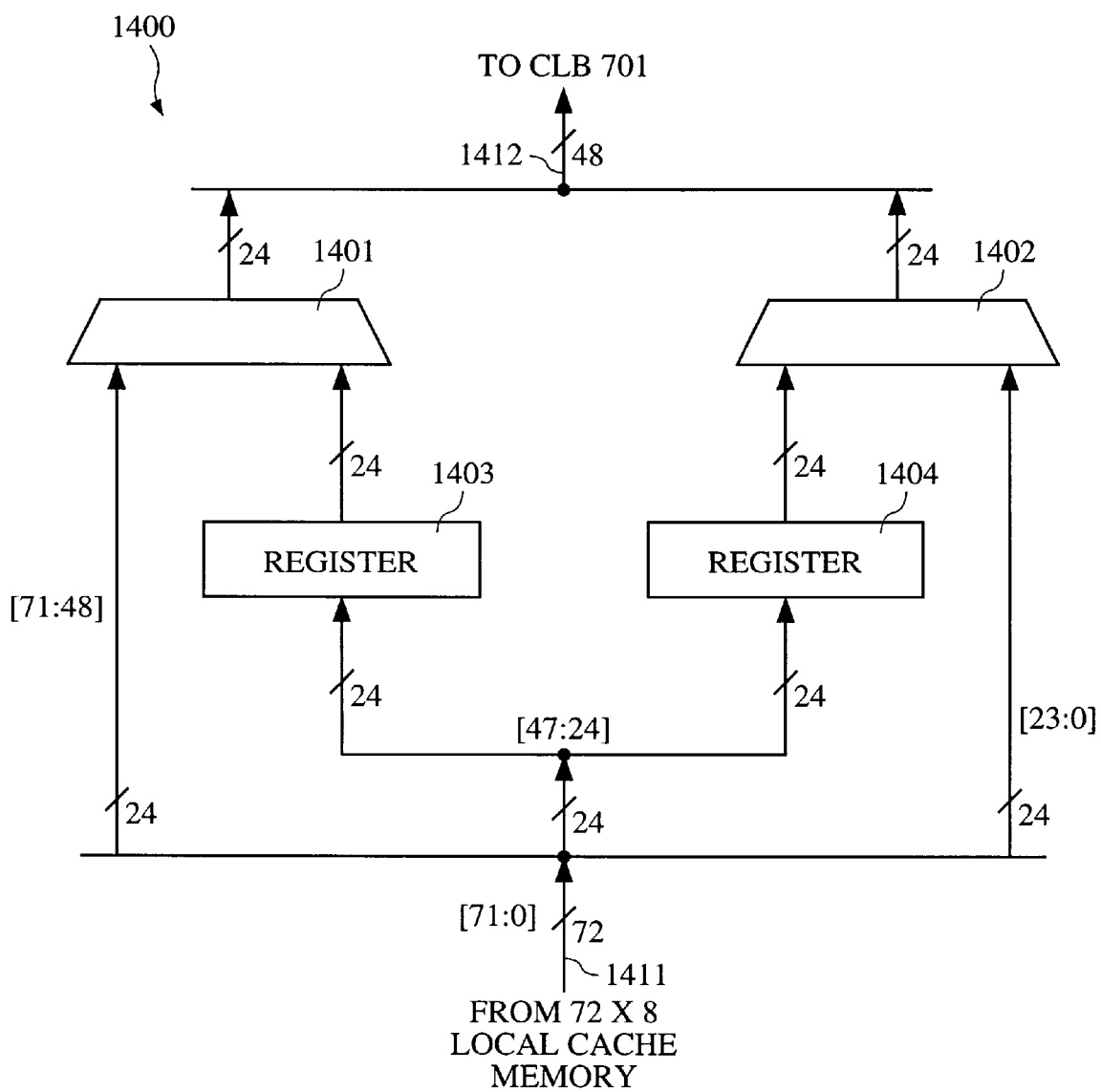
FIG. 14 is a block diagram of a transfer circuit located between a local cache memory and a CLB in accordance with an alternative embodiment of the invention.

Although the local cache memories (e.g., local cache memory 801 (FIG. 9)) have been described as having 13 rows and 48 columns, it is understood that in other embodiments, other dimensions can be used. For example, the local cache memories could have 72 columns and 9 rows. FIG. 14 illustrates a transfer circuit 1400 which is located between the local cache memory 801 and the CLB 701 in such an embodiment. Transfer circuit 1400 includes multiplexers 1401 and 1402 and registers 1403 and 1404. During a first clock cycle, a 72-bit word A[71:0] is provided on bus 1411. The first 24 bits A[71:48] of this 72-bit word are provided to multiplexer 1401, the second 24 bits A[47:24] of this 72-bit word are provided to registers 1403 and 1404, and the third 24 bits A[23:0] of this 72-bit word are provided to multiplexer 1402. During the first cycle, multiplexers 1401 and 1402 are controlled to pass A[71:48] and A[23:0] to the 48-bit bus 1412. Also during the first cycle, A[47:24] is loaded into register 1403. During the second cycle, another 72-bit word B[71:0} is provided on bus 1411. The first 24 bits B[71:48] are provided to multiplexer 1401, the second 24 bits B[47:24] are provided to registers 1403 and 1404, and the third 24 bits B[23:0] are provided to multiplexer 1402. During the second cycle, multiplexers 1401 and 1402 are controlled to pass B[71:48] and B[23:0] to the 48-bit bus 1412. Also during the second cycle, B[47:24] is loaded into register 1404. During the third cycle, multiplexer 1401 is controlled to pass A[47:24] from register 1403 to bus 1412, and multiplexer 1402 is controlled to pass B[47:24] from register 1404 to bus 1412. The foregoing pattern is repeated until the CLB 701 is reconfigured. In an alternate embodiment, register 1404 is eliminated, and B[47:24] is applied directly to multiplexer 1402 during the third cycle.

Although the invention has been described in connection with several embodiments, it is understood that this invention is not limited to the embodiments disclosed, but is capable of various modifications which would be apparent to a person skilled in the art. For example, other embodiments of the present invention may include different state storage structures, such as RAM. Thus, the invention is limited only by the following claims.

We claim:

1. A field programmable gate array (FPGA) comprising:
   a first array of configurable logic blocks having a corresponding first set of configuration memory cells;
   a first configuration cache memory array coupled to the first array of configurable logic blocks, wherein the first configuration cache memory array stores values to be loaded into the first set of configuration memory cells, thereby reconfiguring the first array of configurable logic blocks;
   a second array of configurable logic blocks having a corresponding second set of configuration memory cells;
   a second configuration cache memory array coupled to the second array of configurable logic blocks, wherein the second configuration cache memory array stores values to be loaded into the second set of configuration memory cells, thereby reconfiguring the second array of configurable logic blocks; and
   a control circuit for transferring values between the first configuration cache memory array and the first set of configuration memory cells, and for independently transferring values between the second configuration cache memory array and the second set of configuration memory cells.

2. The FPGA of claim 1, wherein the first configuration cache memory array stores values for reconfiguring the first array of configurable logic blocks in a plurality of configurations.

3. The FPGA of claim 2, wherein the second configuration cache memory array stores values for reconfiguring the second array of configurable logic blocks in a plurality of configurations.

4. The FPGA of claim 1, wherein the values stored in the first configuration cache memory array comprise a first set of configuration data values for programming corresponding configuration memory cells in the first array of configurable logic blocks in a first configuration, and a first set of state data values for programming corresponding state storage structures in the first array of configurable logic blocks to perform a first function.

5. The FPGA of claim 4, wherein the values stored in the first configuration cache memory array further comprise a second set of configuration data values for programming corresponding configuration memory cells in the first array of configurable logic blocks in a second configuration, and a second set of state data values for programming corresponding state storage structures in the first array of configurable logic blocks to perform a second function.

6. The FPGA of claim 5, further comprising means for loading the first set of configuration data values and the first set of state data values from the first configuration cache memory array to the first set of configuration memory cells, thereby configuring the first array of configurable logic blocks in a first configuration.

7. The FPGA of claim 6, further comprising means for loading the second set of configuration data values and the second set of state data values from the first configuration cache memory array to the first set of configuration memory cells, thereby configuring the first array of configurable logic blocks in a second configuration.

8. The FPGA of claim 6, further comprising means for loading the first set of configuration data values and the second set of state data values from the first configuration cache memory array to the first set of configuration memory cells, thereby configuring the first array of configurable logic blocks in a second configuration.

9. The FPGA of claim 1, wherein each of the configurable logic blocks in the first array of configurable logic blocks has a corresponding local configuration memory block in the first configuration cache memory array.

10. The FPGA of claim 9, wherein each local configuration memory block stores values associated with a plurality of configurations of a corresponding configurable logic block.

11. The FPGA of claim 1, further comprising a configuration port for accessing the first and second configuration cache memory arrays.

12. The FPGA of claim 1, wherein the control circuit is configured to load values from the first configuration cache memory array to the first set of configuration memory cells over a plurality of operating cycles.

13. The FPGA of claim 12, wherein the control circuit is configured to load values from the second configuration cache memory array to the second set of configuration memory cells over a plurality of operating cycles.

14. The FPGA of claim 1, wherein the first array of configurable logic blocks is arranged in a plurality of rows and the first configuration cache memory array is arranged in a plurality of rows, wherein the rows of the first array of configurable logic blocks are interleaved with the rows of the first configuration cache memory array.

15. The FPGA of claim 14, wherein the second array of configurable logic blocks is arranged in a plurality of rows and the second configuration cache memory array is arranged in a plurality of rows, wherein the rows of the second array of configurable logic blocks are interleaved with the rows of the second configuration cache memory array.

16. The FPGA of claim 15, wherein the first array of configurable logic blocks and the first configuration cache memory array are located on a first half of the FPGA, and the second array of configurable logic blocks and the second configuration cache memory array are located on a second half of the FPGA.

17. The FPGA of claim 1, wherein the values stored in the first configuration cache memory array comprise a first set of state data values for programming corresponding flip-flops in the configurable logic block.

18. The FPGA of claim 1, wherein the values stored in the first configuration cache memory array comprise a first set of state data values for programming corresponding function generators in the first array of configurable logic blocks to perform a first function.

19. A field programmable gate array (FPGA) comprising:
a first array of configurable logic blocks having a corresponding first set of configuration memory cells;
a first configuration cache memory array coupled to the first array of configurable logic blocks, wherein the first configuration cache memory array stores values to be loaded into the first set of configuration memory cells, thereby reconfiguring the first array of configurable logic blocks;
a second array of configurable logic blocks having a corresponding second set of configuration memory cells;
a second configuration cache memory array coupled to the first configuration cache memory array, wherein the second configuration cache memory array stores values to be loaded into the first set of configuration memory cells, thereby reconfiguring the first array of configurable logic blocks; and
control circuitry for transferring values from the second configuration cache memory array to the first configuration cache memory array.

20. A field programmable gate array (FPGA) comprising:
a first array of configurable logic blocks having a corresponding first set of configuration memory cells;
a first configuration cache memory array coupled to the first array of configurable logic blocks, wherein the first configuration cache memory array stores values to be loaded into the first set of configuration memory cells, thereby reconfiguring the first array of configurable logic blocks;
a second array of configurable logic blocks having a corresponding second set of configuration memory cells;
a second configuration cache memory array coupled to the second array of configurable logic blocks; and
a control circuit for configuring the second configuration cache memory array to either store values to be loaded into the second set of configuration memory cells, thereby reconfiguring the second array of configurable logic blocks, or to operate as a random access memory.

21. A method of operating a field programmable gate array (FPGA) comprising the steps of:
providing a first array of configurable logic blocks and a second array of configurable logic blocks on the FPGA;
providing a first configuration cache memory array coupled to the first array of configurable logic blocks and a second configuration cache memory array coupled to the second array of configurable logic blocks;
reconfiguring the first array of configurable logic blocks in response to values stored in the first configuration cache memory array; and
reconfiguring the second array of configurable logic blocks in response to values stored in the second configuration cache memory array, wherein the step of reconfiguring the first array of configurable logic blocks is performed independent of the step of reconfiguring the second array of configurable logic blocks, thereby enabling partial reconfiguration of the FPGA.

22. The method of claim 21, wherein the step of reconfiguring the first array of configurable logic blocks further comprises the step of loading the values stored in the first configuration memory array to the first array of configurable logic blocks over a plurality of operating cycles.

23. The method of claim 22, wherein the values stored in the first configuration memory array comprise a first set of configuration data values for programming corresponding configuration memory cells in the first array of configurable logic blocks in a first configuration, and a first set of state data values for programming corresponding state storage structures in the first array of configurable logic blocks to perform a first function, the method further comprising the steps of:

clearing the first array of configurable logic blocks;

loading the first set of configuration data values into the first array of configurable logic blocks over a plurality of operating cycles; and loading the first set of state data values into the first array of configurable logic blocks.

24. The method of claim 22, wherein the values stored in the first configuration memory array comprise a first set of configuration data values for programming corresponding configuration memory cells in the first array of configurable logic blocks in a first configuration, and wherein the first array of configurable logic blocks includes a plurality of state storage structures which store a first set of state data values, the method further comprising the steps of:

storing the first set of state data values in the first configuration memory array;

clearing the first array of configurable logic blocks;

loading the first set of configuration data values from the first configuration memory array to the first array of configurable logic blocks over a plurality of operating cycles; and loading the first set of state data values from the first configuration memory array into the first array of configurable logic blocks.

25. A method of operating a field programmable gate array (FPGA) comprising the steps of:

providing a first array of configurable logic blocks and a second array of configurable logic blocks on the FPGA;

providing a first configuration cache memory array coupled to the first array of configurable logic blocks and a second configuration cache memory array coupled to the first configuration cache memory array;

reconfiguring the first array of configurable logic blocks in response to values stored in the first configuration cache memory array;

transferring the values stored in the second configuration cache memory array to the first configuration cache memory array; and reconfiguring the first array of configurable logic blocks in response to values transferred from the second configuration cache memory array to the first configuration cache memory array.

26. A field programmable gate array (FPGA) comprising:

an array of configurable logic blocks;

an array of random access memory (RAM) blocks for storing one or more sets of configuration data values for configuring the configurable logic blocks, wherein each RAM block has a corresponding configurable logic block;

a plurality of configuration buses, wherein each configuration bus couples a RAM block to a corresponding configurable logic block; and a control circuit for transferring values between the array of configurable logic blocks and the array of RAM blocks, wherein the control circuit is configured to route a set of configuration data values from the RAM blocks to the configurable logic blocks on the configuration buses over a plurality of cycles.

27. The FPGA of claim 26, wherein each RAM block comprises:

a configuration data cache memory for storing configuration data values for configuring a configurable logic block; and a state data cache memory for storing state data values associated with the configurable logic block.

28. The FPGA of claim 27, wherein each RAM block further comprises a memory dedicated to storing state data values.

29. The FPGA of claim 26, wherein each RAM block further comprises a plurality of local cache memories, wherein each local cache memory comprises a configuration data cache memory for storing configuration data values for configuring a configurable logic block, and a state data cache memory for storing state data values associated with the configurable logic block.

30. A field programmable gate array (FPGA) comprising:

an array of configurable logic blocks;

an array of random access memory (RAM) blocks for storing one or more sets of configuration data values for configuring the configurable logic blocks, wherein each RAM block has a corresponding configurable logic block; and a plurality of configuration buses, wherein each configuration bus couples a RAM block to a corresponding configurable logic block, wherein the configuration data values are routed from the RAM blocks to the configurable logic blocks on the configuration buses over a plurality of cycles, wherein the configuration buses are bi-directional, such that the configuration data values are also routed from the configurable logic blocks to the RAM blocks on the configuration buses.

31. A field programmable gate array (FPGA) comprising:

an array of configurable logic blocks;

an array of random access memory (RAM) blocks for storing one or more sets of configuration data values for configuring the configurable logic blocks, wherein each RAM block has a corresponding configurable logic block;

a plurality of configuration buses, wherein each configuration bus couples a RAM block to a corresponding configurable logic block, wherein the configuration data values are routed from the RAM blocks to the configurable logic blocks on the configuration buses over a plurality of cycles;

a plurality of random access buses, wherein each random access bus couples a RAM block to a corresponding configurable logic block, each of the random access buses comprising an address bus for providing an address from the configurable logic block to the RAM block, a first data bus for providing data from the configurable logic block to the RAM block, and a second data bus for providing data from the RAM block to the configurable logic block; and circuitry for accessing the RAM blocks as random access memory through the configurable logic blocks using the random access buses.

32. The FPGA of claim 31, further comprising an expansion bus which is programmable to couple adjacent RAM blocks.

33. A field programmable gate array (FPGA) comprising:

an array of configurable logic blocks;

an array of random access memory (RAM) blocks for storing one or more sets of configuration data values for configuring the configurable logic blocks, wherein each RAM block has a corresponding configurable logic block, and wherein each RAM block comprises:
- a configuration data cache memory for storing configuration data values for configuring a configurable logic block; and
- a state data cache memory for storing state data values associated with the configurable logic block;

a plurality of configuration buses, wherein each configuration bus couples a RAM block to a corresponding configurable logic block, wherein the configuration data values are routed from the RAM blocks to the configurable logic blocks on the configuration buses over a plurality of cycles; and means for independently transferring state data values between the state data cache memory and the configurable logic block.

34. A field programmable gate array (FPGA) comprising:

an array of configurable logic blocks;

an array of random access memory (RAM) blocks; and a plurality of random access buses, wherein each random access bus is programmable to couple a RAM block to a corresponding configurable logic block, each of the random access buses comprising an address bus for providing an address from the configurable logic block to the RAM block, a first data bus for providing data from the configurable logic block to the RAM block, and a second data bus for providing data from the RAM block to the configurable logic block; and circuitry for accessing the RAM blocks as random access memory through the configurable logic blocks using the first buses.

35. The FPGA of claim 34, further comprising an expansion bus which is programmable to couple adjacent RAM blocks.

36. The FPGA of claim 35, wherein the expansion bus comprises a first expansion bus which selectively couples adjacent RAM blocks along a first direction, and a second expansion bus which selectively couples adjacent RAM blocks along a second direction.

37. The FPGA of claim 34, further comprising a communications port providing an interface between the RAM blocks and circuitry external to the FPGA.

* * * * *